(12) United States Patent
Suzuki et al.

(10) Patent No.: US 9,748,505 B2
(45) Date of Patent: Aug. 29, 2017

(54) DISPLAY DEVICE WITH BENT PORTION IN PERIPHERAL AREA

(71) Applicant: Japan Display Inc., Tokyo (JP)

(72) Inventors: Takayasu Suzuki, Tokyo (JP); Norio Oku, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/066,817

(22) Filed: Mar. 10, 2016

(65) Prior Publication Data

US 2016/0268524 A1 Sep. 15, 2016

(30) Foreign Application Priority Data

Mar. 12, 2015 (JP) ................... 2015-049703

(51) Int. Cl.
| | | |
|---|---|---|
| *H01L 51/00* | (2006.01) | |
| *G02F 1/1333* | (2006.01) | |
| *H01L 27/32* | (2006.01) | |
| *H05K 1/02* | (2006.01) | |
| *H04M 1/02* | (2006.01) | |
| *H01L 23/00* | (2006.01) | |
| *H01L 51/52* | (2006.01) | |

(52) U.S. Cl.
CPC ...... *H01L 51/0097* (2013.01); *G02F 1/13338* (2013.01); *G02F 1/133305* (2013.01); *H01L 24/32* (2013.01); *H01L 51/0024* (2013.01); *H01L 51/5246* (2013.01); *H04M 1/0268* (2013.01); *H05K 1/028* (2013.01); *H01L 27/323* (2013.01); *H01L 27/3276* (2013.01); *H01L 2227/323* (2013.01); *Y02E 10/549* (2013.01)

(58) Field of Classification Search
CPC ............ H01L 51/5246; H01L 27/323; H01L 51/0097; H01L 51/0024; H01L 2251/5338; H01L 24/02–24/09; G06F 3/0412; G06F 2203/04102; G06F 1/1652; G02F 1/13338; G02F 1/133305; H05K 1/028; H05K 1/0281; H04M 1/0268
See application file for complete search history.

(56) References Cited

U.S. PATENT DOCUMENTS

| | | | | |
|---|---|---|---|---|
| 2011/0050657 A1* | 3/2011 | Yamada | ............. | H01L 27/3293 345/204 |
| 2012/0211080 A1* | 8/2012 | Niiyama | ............. | C08F 290/067 136/259 |

(Continued)

FOREIGN PATENT DOCUMENTS

| | | |
|---|---|---|
| JP | 2003-280542 A | 10/2003 |
| JP | 2011-034066 A | 2/2011 |

OTHER PUBLICATIONS

Korean Office Action mailed on Mar. 10, 2017 for corresponding KR Patent Application No. 10-2016-0028310, With Translation.

*Primary Examiner* — Daniel Luke
(74) *Attorney, Agent, or Firm* — Typha IP LLC (57) ABSTRACT

A display device includes a first substrate having a display area and a first peripheral area, a second substrate having a second peripheral area, a first filler between the first substrate and the second substrate, and a first adhesive outside the first filler. The first adhesive bonds the first peripheral area and the second peripheral area. The first substrate has a first bent portion in the first peripheral area. The second substrate has a second bent portion in the second peripheral area.

10 Claims, 6 Drawing Sheets

(56) References Cited

U.S. PATENT DOCUMENTS

| | | | | |
|---|---|---|---|---|
| 2013/0002133 A1* | 1/2013 | Jin | ............................ | G09F 9/33 |
| | | | | 313/511 |
| 2013/0077033 A1* | 3/2013 | Li | ......................... | G02F 1/1333 |
| | | | | 349/122 |
| 2014/0118902 A1* | 5/2014 | Kim | .................. | G02F 1/133308 |
| | | | | 361/679.01 |
| 2014/0132488 A1* | 5/2014 | Kim | ........................ | H01L 51/52 |
| | | | | 345/76 |
| 2014/0268606 A1* | 9/2014 | Chen | ...................... | H05K 3/284 |
| | | | | 361/760 |
| 2014/0306941 A1* | 10/2014 | Kim | ...................... | G06F 1/1652 |
| | | | | 345/204 |
| 2014/0355227 A1* | 12/2014 | Lim | ........................ | H05K 1/028 |
| | | | | 361/749 |
| 2015/0048349 A1* | 2/2015 | Kawata | ............... | H01L 51/0097 |
| | | | | 257/40 |
| 2015/0075705 A1* | 3/2015 | Qiao | ................... | H01L 51/5246 |
| | | | | 156/247 |
| 2015/0212548 A1* | 7/2015 | Namkung | ............. | G06F 1/1652 |
| | | | | 345/174 |

* cited by examiner

DISPLAY DEVICE WITH BENT PORTION IN PERIPHERAL AREA

CROSS-REFERENCE TO RELATED APPLICATION

The present application claims priority from Japanese application JP2015-049703 filed on Mar. 12, 2015, the content of which is hereby incorporated by reference into this application.

BACKGROUND OF THE INVENTION

1. Field of the Invention

The present invention relates to a display device and a method for manufacturing the display device.

2. Description of the Related Art

A display device includes an image display substrate having a display area provided with an image display function, a counter substrate disposed facing the image display substrate, and a flexible wiring substrate electrically coupled to the image display substrate. The flexible wiring substrate is joined to an edge of the image display substrate. For such a display device, it is known that a flexible wiring substrate is bent to downsize the device, for example, as disclosed in JP 2003-280542 A.

Nowadays, it is expected to further downsize a display device while maintaining the size of its display area. For a display device including a substrate with a bent edge for downsizing, it is desirable that strain generated at the bent portion be as small as possible.

SUMMARY OF THE INVENTION

In view of the above problem, it is an object of the present invention to provide a display device and a method for manufacturing the display device that achieve downsizing thereof and reduce strain generated at its bent portion.

A display device according to an aspect of the present invention includes a first substrate having a display area and a first peripheral area, a second substrate having a second peripheral area, a first filler between the first substrate and the second substrate, and a first adhesive outside the first filler. The first adhesive bonds the first peripheral area and the second peripheral area. The first substrate has a first bent portion in the first peripheral area. The second substrate has a second bent portion in the second peripheral area.

A method for manufacturing a display device according to an aspect of the present invention includes the following steps. First substrate and second substrate are prepared. The first substrate and the second substrate are flexible. The first substrate has a display area provided with an image display function and a first peripheral area outside the display area. The second substrate has an additional function area provided with a function added to the image display function and a second peripheral area outside the additional function area. The display area of the first substrate and the additional function area of the second substrate are bonded together so that the first peripheral area and the second peripheral area face each other without being bonded together. The first substrate in the first peripheral area is bent in the direction opposite to the second substrate. The second substrate in the second peripheral area is bent in the same direction as the first substrate is bent. The bent first peripheral area and the bent second peripheral area are bonded together.

DETAILED DESCRIPTION OF THE INVENTION

The following describes embodiments of the present invention with reference to the accompanying drawings.

Figure 3:
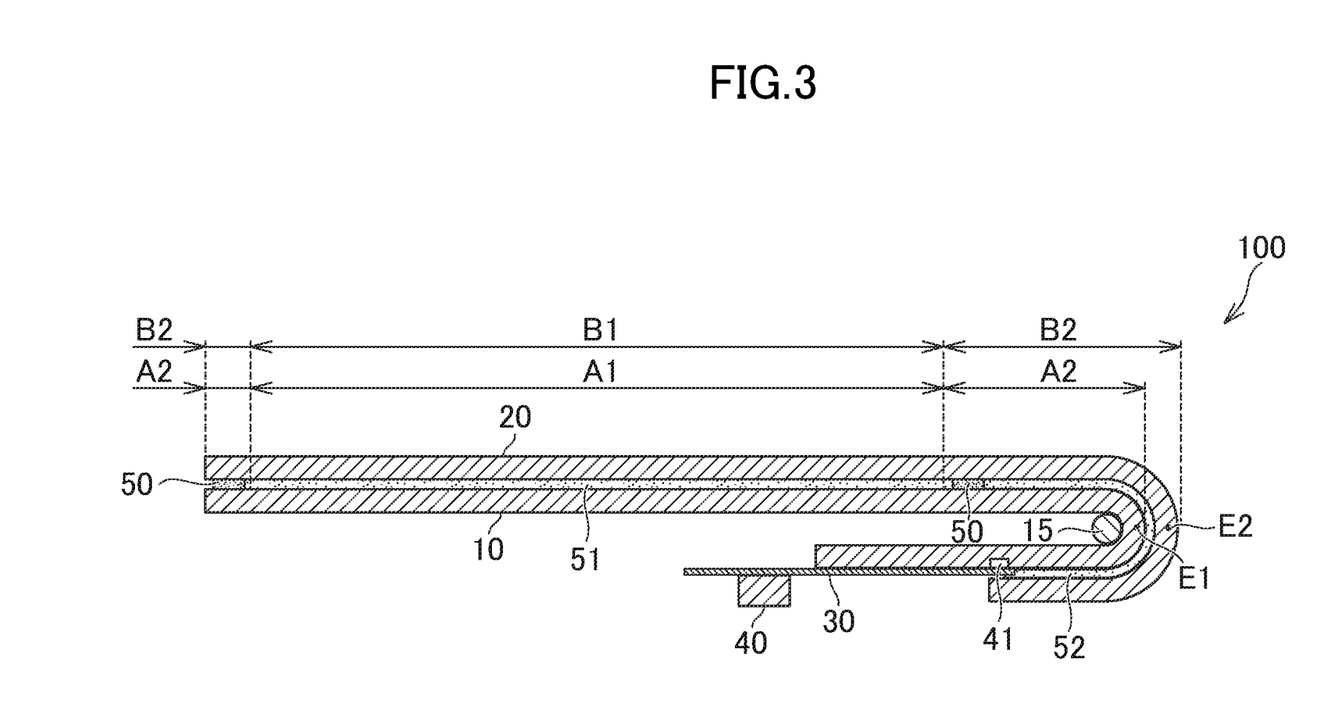
FIG. 3 is a schematic cross-sectional view of the display device according to the first embodiment.

First, a configuration of a display device 100 according to a first embodiment of the present invention is described with reference to FIG. 3. FIG. 3 is a schematic cross-sectional view of the display device 100 according to the first embodiment, taken along a plane parallel to the longitudinal direction of a thin film transistor (TFT) substrate 10. The direction perpendicular to FIG. 3 is defined as the transverse direction of the TFT substrate 10, and the direction perpendicular to the transverse direction is defined as the longitudinal direction of the TFT substrate 10.

As shown in FIG. 3, the display device 100 includes the TFT substrate 10 as a first substrate, a counter substrate 20 as a second substrate, and a flexible wiring substrate 30 as a first flexible wiring substrate.

The TFT substrate 10 includes a TFT circuit layer, an organic electroluminescent (EL) layer, a sealing layer, and other layers. The TFT circuit layer controls light emission of the organic EL layer. The sealing layer is made of an inorganic insulating material that covers the organic EL layer. The TFT substrate 10 is a flexible substrate whose planar shape is substantially rectangular.

The TFT substrate 10 has a display area A1 provided with an image display function and a peripheral area A2 as a first peripheral area. The peripheral area A2 is outside the display area A1. In the display area A1, thin film transistors and display elements are disposed. The TFT substrate 10 has a first terminal 41 in the peripheral area A2. The first terminal 41 is used for external electrical connection.

The counter substrate 20 has an additional function area B1 provided with a function added to the image display function of the TFT substrate 10 and a peripheral area B2 as a second peripheral area. The peripheral area B2 is outside the additional function area B1. The counter substrate 20 is disposed overlying the first terminal 41. Examples of the counter substrate 20 include a color filter substrate that has, as an additional function, the function of allowing a color of a specific wavelength to pass through it and of blocking colors of the other wavelengths from passing through it.

The flexible wiring substrate 30 is a substrate formed of a base material made by laminating an insulating resin material and a conductive metal and has an electric circuit. The flexible wiring substrate 30 is joined to an edge in the longitudinal direction of the TFT substrate 10 and is electrically coupled to the first terminal 41 of the TFT substrate 10. Signals for controlling the image display function of the TFT substrate 10 are input to the flexible wiring substrate 30. The flexible wiring substrate 30 has, as an electronic component, an integrated circuit (IC) 40 that is mounted at a position closer to its edge longitudinally opposite to its portion joined to the TFT substrate 10 than the portion joined to the TFT substrate 10.

The TFT substrate 10 and the counter substrate 20 are bonded together with a sealant 50 enclosing both the display area A1 and the additional function area B1 and with a filler 51 (first filler) disposed in the region enclosed by the sealant 50. The display area A1 and the additional function area B1 are positioned to face each other and are both substantially rectangular in plan. The sealant 50 is disposed around the periphery of both the display area A1 and the additional function area B1. The region sandwiched between the display area A1 and the additional function area B1 is filled with the filler 51. For example, a dam material is used as the sealant 50.

The TFT substrate 10 in the peripheral area A2 is bent in the direction opposite to the counter substrate 20. The display device 100 includes a guide 15 having a curved surface that conforms to the bend of the TFT substrate 10. The guide 15 is a cylindrical or columnar member extending in the direction parallel to the transverse direction of the TFT substrate 10.

The counter substrate 20 in the peripheral area B2 is bent in the same direction as the TFT substrate 10 is bent. Use of such a configuration, that is, bending the TFT substrate 10 and the counter substrate 20 reduces the peripheral area A2 that is on the same plane as the display area Al, thus narrowing the frame of the display device 100. Consequently, the display device 100 can be made more compact with the size of the display area A1 maintained.

The TFT substrate 10 in the peripheral area A2 including a first bent portion E1 and the counter substrate 20 in the peripheral area B2 including a second bent portion E2 are bonded together with an adhesive 52. Part of the adhesive 52 is disposed to partially cover the flexible wiring substrate 30. The adhesive 52 may be the same material as or a different material than the filler 51.

Figure 1:
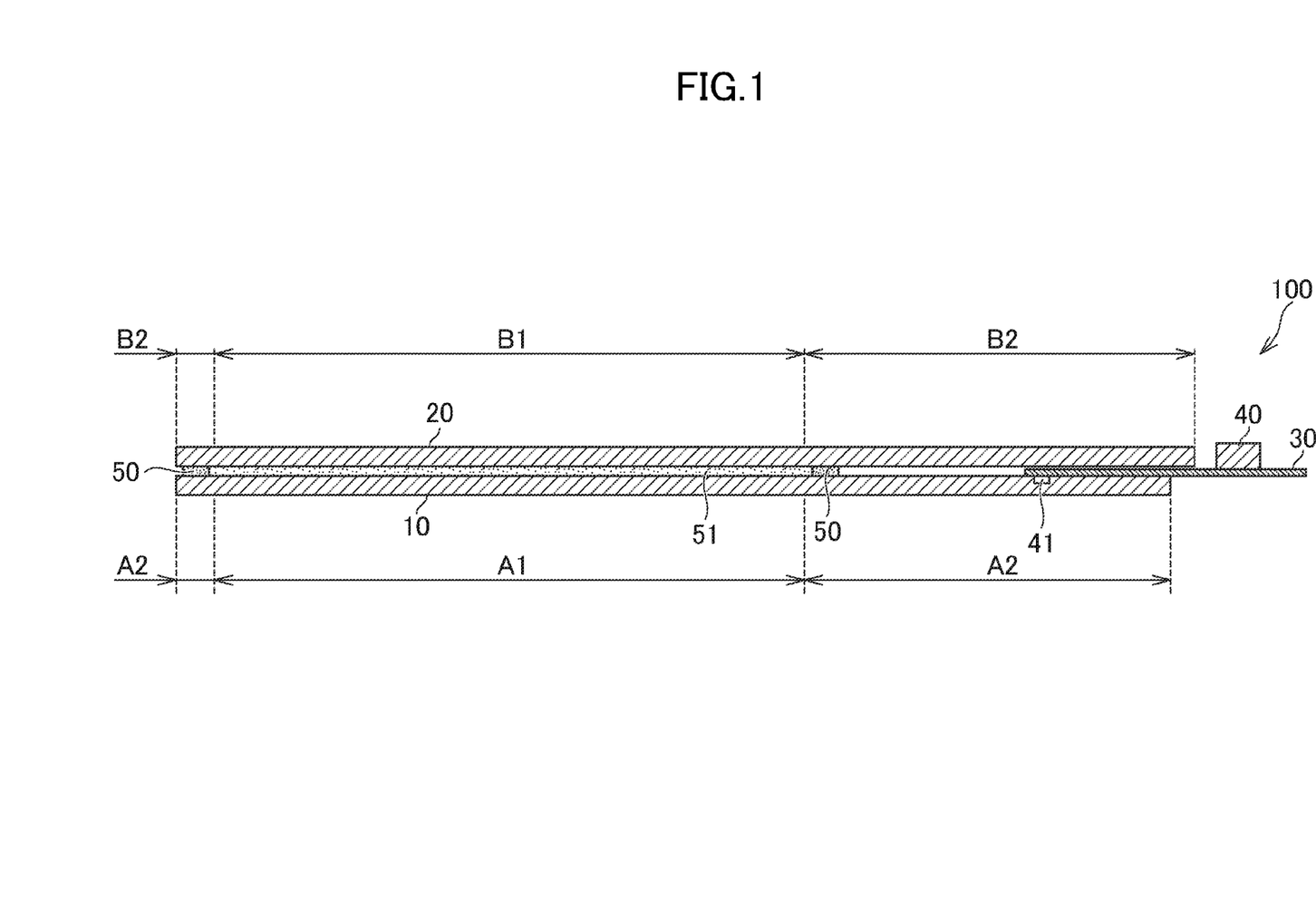
FIG. 1 is a schematic cross-sectional view of a display device according to a first embodiment before the step of bending its TFT substrate and counter substrate in a method for manufacturing the display device.
Figure 2:
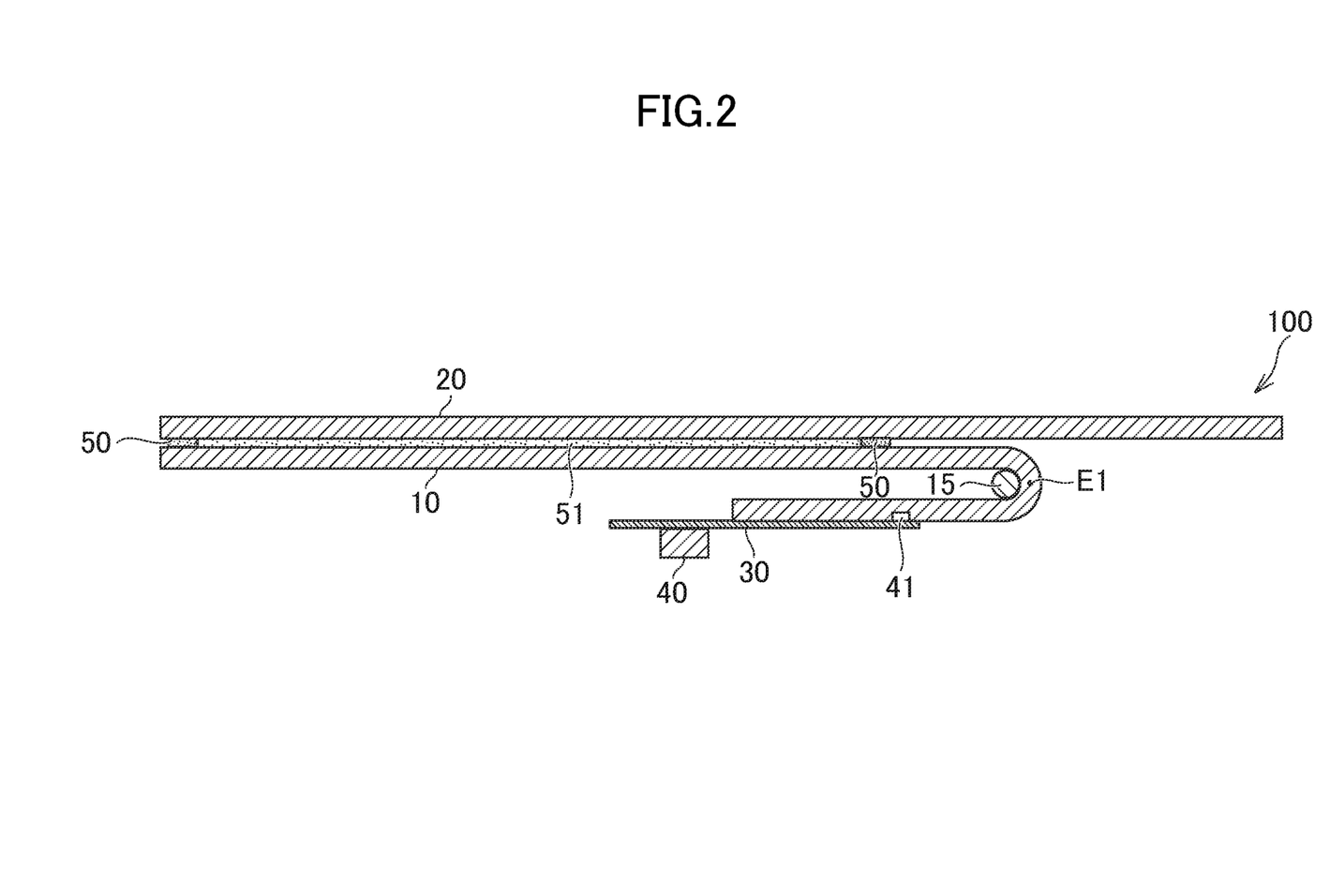
FIG. 2 is a schematic cross-sectional view of the display device according to the first embodiment after the step of bending the TFT substrate, before the step of bending the counter substrate in the method for manufacturing the display device.

The following describes a method for manufacturing the display device 100 according to the first embodiment with reference to FIGS. 1 to 3. FIG. 1 is a schematic cross-sectional view of the display device 100 according to the first embodiment before the step of bending the TFT substrate 10 and the counter substrate 20 in the method for manufacturing the display device 100. FIG. 2 is a schematic cross-sectional view of the display device 100 according to the first embodiment after the step of bending the TFT substrate 10, before the step of bending the counter substrate 20 in the method for manufacturing the display device 100.

First, the TFT substrate 10 is prepared. Subsequently, the flexible wiring substrate 30, to which signals for controlling the image display function are input, is mounted on the TFT substrate 10 so as to be electrically coupled to the first terminal 41 of the TFT substrate 10.

Next, the counter substrate 20 is prepared. Then, as shown in FIG. 1, the display area A1 of the TFT substrate and the additional function area B1 of the counter substrate 20 are bonded together so that the peripheral area A2 of the TFT substrate 10 and the peripheral area B2 of the counter substrate 20 face each other without being bonded together. The display area A1 and the additional function area B1 are bonded together with the sealant 50 enclosing both the display area A1 and the additional function area B1 and with the filler 51 disposed in the region enclosed by the sealant 50. The filler 51 and the sealant 50 bond or adhere the TFT substrate 10 and the counter substrate 20 so that their relative position is maintained.

Subsequently, as shown in FIG. 2, the TFT substrate in the peripheral area A2 is bent in the direction opposite to the counter substrate 20. TFT substrate 10 is bent by using the guide 15 having a curved surface that conforms to the bend of the TFT substrate 10. Use of the guide 15 allows the TFT substrate 10 to be bent into a preferable shape without deflection or the like.

After the TFT substrate 10 is bent, as shown in FIG. 3, the counter substrate 20 in the peripheral area B2 is bent in the same direction as the TFT substrate 10 is bent. After that, the bent peripheral area A2 of the TFT substrate 10 and the bent peripheral area B2 of the counter substrate 20 are bonded together with the adhesive 52.

Here, bending the counter substrate 20 causes a tensile stress on the outside of the second bent portion E2 and also causes a compressive stress on the inside of the bent curved portion E2. Moreover, bending the TFT substrate 10 causes a tensile stress on the outside of the first bent portion E1 and also causes a compressive stress on the inside of the first bent portion E1. Similarly, if the TFT substrate 10 and the counter substrate 20 already bonded together were bent, a tensile stress would be generated on the outside of the bent portion of the adhesive 52 and a compressive stress would be generated on the inside of the bent portion of the adhesive 52. These tensile stresses and compressive stresses cause strain generated at the bent portion of the display device 100.

In the method for manufacturing the display device 100 according to the first embodiment, the TFT substrate is bent and then the counter substrate 20 is bent. In this manner, the TFT substrate 10 and the counter substrate 20 are individually bent, and then the substrates are bonded together with the adhesive 52 (first adhesive). Thus, neither internal tensile stress nor internal compressive stress occurs in the bent portion of the adhesive 52. Accordingly, the total stress at the bent portion of the display device 100 is reduced as compared with a case where the TFT substrate 10 and the counter substrate 20 are first bonded together with the adhesive and then bent. Consequently, strain generated at the bent portion of the display device 100 is reduced.

Figure 4:
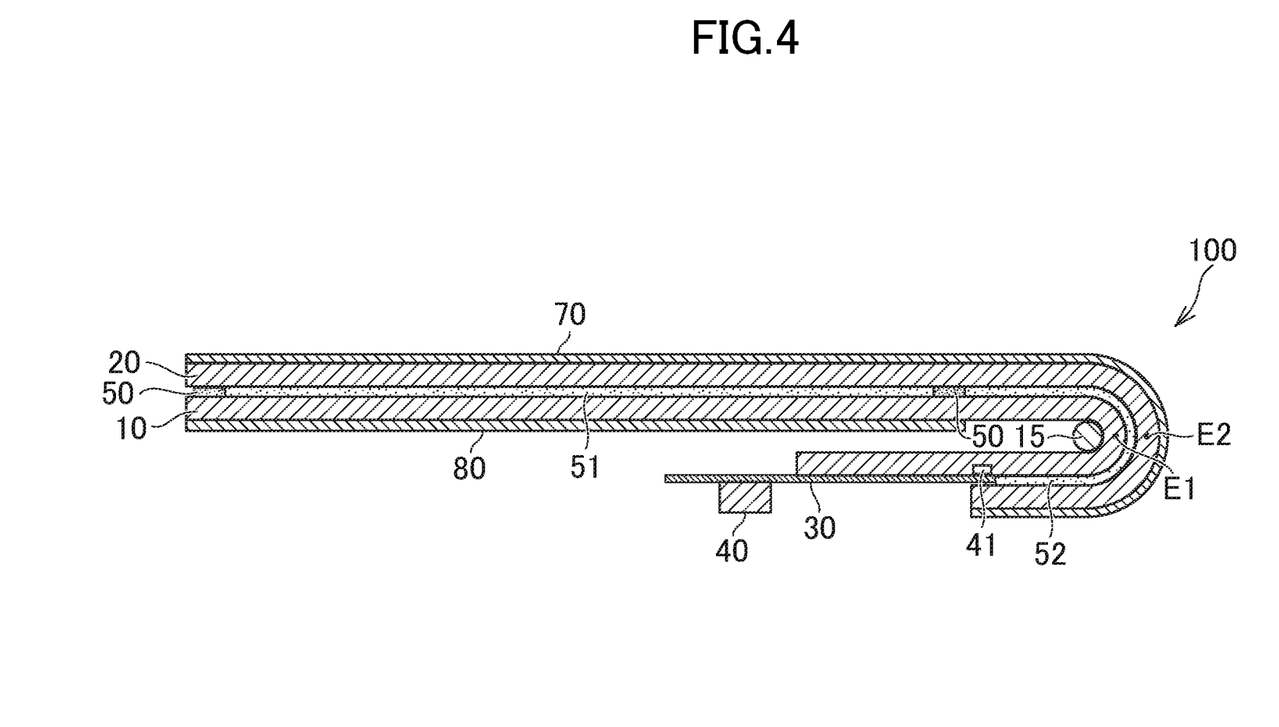
FIG. 4 is a schematic cross-sectional view of a display device according to a modification of the first embodiment.

As shown in FIG. 4, the display device 100 according to the first embodiment may include a protective film 70 on the opposite side of the counter substrate 20 from the TFT substrate 10 and a protective film 80 on the opposite side of the TFT substrate 10 from the counter substrate 20. In this case, the method for manufacturing the display device 100 according to the first embodiment includes the step of attaching the protective film 70 to the counter substrate 20 so as to overlap both the additional function area B1 and the peripheral area B2, after the step of bonding the bent peripheral area A2 and the bent peripheral area B2. The protective film 70 that is first attached to the counter substrate 20 and then bent could cause strain at the bent portion of the display device 100. However, the protective film 70 in this example, which is attached to the counter substrate 20 after the counter substrate 20 is bent, does not cause such strain.

The protective film 80 is preferably attached to the TFT substrate 10 before the TFT substrate 10 is bent. It is also preferable that the protective film 80 have a shorter longitudinal length than the flat portion of the TFT substrate 10 so as not to affect the step of bending the TFT substrate 10.

Figure 5:
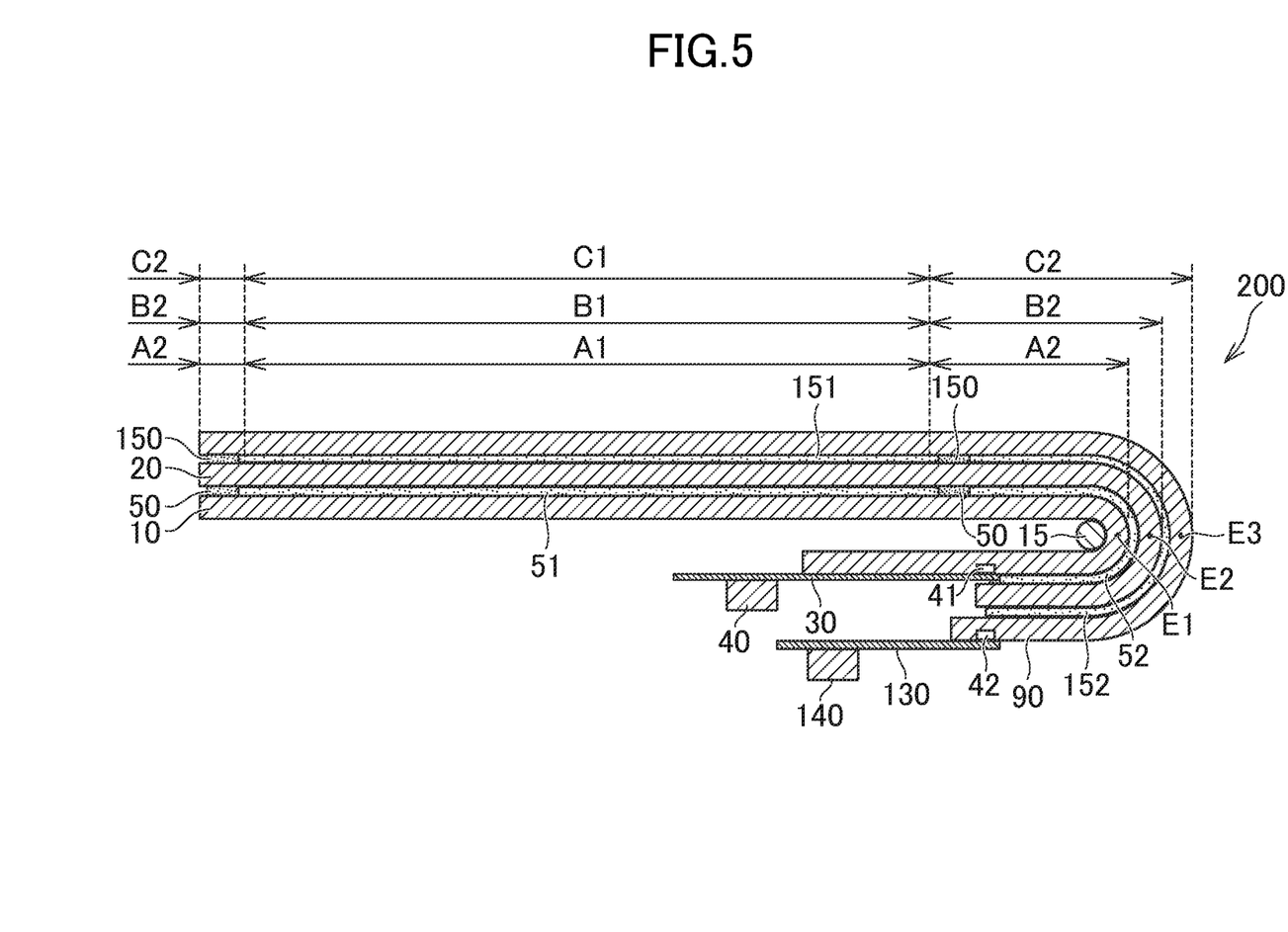
FIG. 5 is a schematic cross-sectional view of a display device according to a second embodiment.

The following describes a display device 200 according to a second embodiment of the present invention with reference to FIG. 5. FIG. 5 is a schematic cross-sectional view of the display device 200 according to the second embodiment.

As shown in FIG. 5, the display device 200 according to the second embodiment includes a touch screen 90 as a third substrate and a flexible wiring substrate 130 as a second flexible wiring substrate, in addition to the configuration of the display device 100 shown in FIG. 3.

The counter substrate 90 has a touch input area C1 provided with a touch input function added to the image display function of the TFT substrate 10 and a peripheral area C2 as a third peripheral area. The peripheral area C2 is outside the touch input area C1. The touch screen 90 has a second terminal 42 in the peripheral area C2. The second terminal 42 is used for external electrical connection.

Signals for controlling the touch input function of the touch screen 90 are input to the flexible wiring substrate 130. The flexible wiring substrate 130 is electrically coupled to the second terminal 42, which the touch screen 90 has in the peripheral area C2. The flexible wiring substrate 130 is arranged to overlap with the flexible wiring substrate 30. The flexible wiring substrate 130 has, as an electronic component, an IC 140 that is mounted at a position closer to its edge longitudinally opposite to its portion joined to the touch screen 90 than the portion joined to the touch screen 90.

A method for manufacturing the display device 200 according to the second embodiment includes the step of bonding the additional function area B1 of the counter substrate 20 and the touch input area C1 of the touch screen 90 so that the peripheral areas B2 and C2 face each other without being bonded together. The method further includes the step of bending the touch screen 90 in the peripheral area C2 in the same direction as the counter substrate 20 is bent. The method further includes the step of bonding the bent peripheral area B2 of the counter substrate 20 and the bent peripheral area C2 of the touch screen 90.

The step of bending the touch screen 90 may be performed after the step of bonding the bent peripheral area A2 of the TFT substrate 10 and the bent peripheral area B2 of the counter substrate 20, or may be performed after the step of bending the counter substrate 20, before the step of bonding the bent peripheral area A2 of the TFT substrate 10 and the bent peripheral area B2 of the counter substrate 20.

The additional function area B1 and the touch input area C1 are bonded together in the same manner as the display area A1 and the additional function area B1 are bonded. That is, a sealant 150 is disposed around the periphery of both the additional function area B1 and the touch input area C1, and then the region sandwiched between the additional function area B1 and the touch input area C1 is filled with a filler 151 (second filler).

The counter substrate 20 in the peripheral area B2 including the second bent portion E2 and the touch screen in the peripheral area C2 including a third bent portion E3 are bonded together with an adhesive 152.

If the peripheral area B2 of the counter substrate 20 and the peripheral area C2 of the touch screen 90 already bonded together with the adhesive 152 (second adhesive) were bent, a tensile stress would be generated on the outside of the bent portion of the adhesive 152 and a compressive stress would be generated on the inside of the bent portion. However, in the method for manufacturing the display device 200 according to the second embodiment, the counter substrate 20 and the touch screen 90 are individually bent, and then the peripheral area B2 of the counter substrate 20 and the peripheral area C2 of the touch screen 90 are bonded together with the adhesive 152. Thus, no internal stress occurs in the adhesive 152. Accordingly, the total stress at the bent portion of the display device 200 is reduced. Consequently, strain generated at the bent portion of the display device 200 is reduced.

With the TFT substrate 10 and the touch screen 90 being bent, the IC 40 to be mounted on the flexible wiring substrate 30 and the IC 140 to be mounted on the flexible wiring substrate 130 are arranged at different positions in the longitudinal direction of the display device 200, as shown in FIG. 5. Thus, the ICs 40 and 140 do not interfere with each other.

Figure 6:
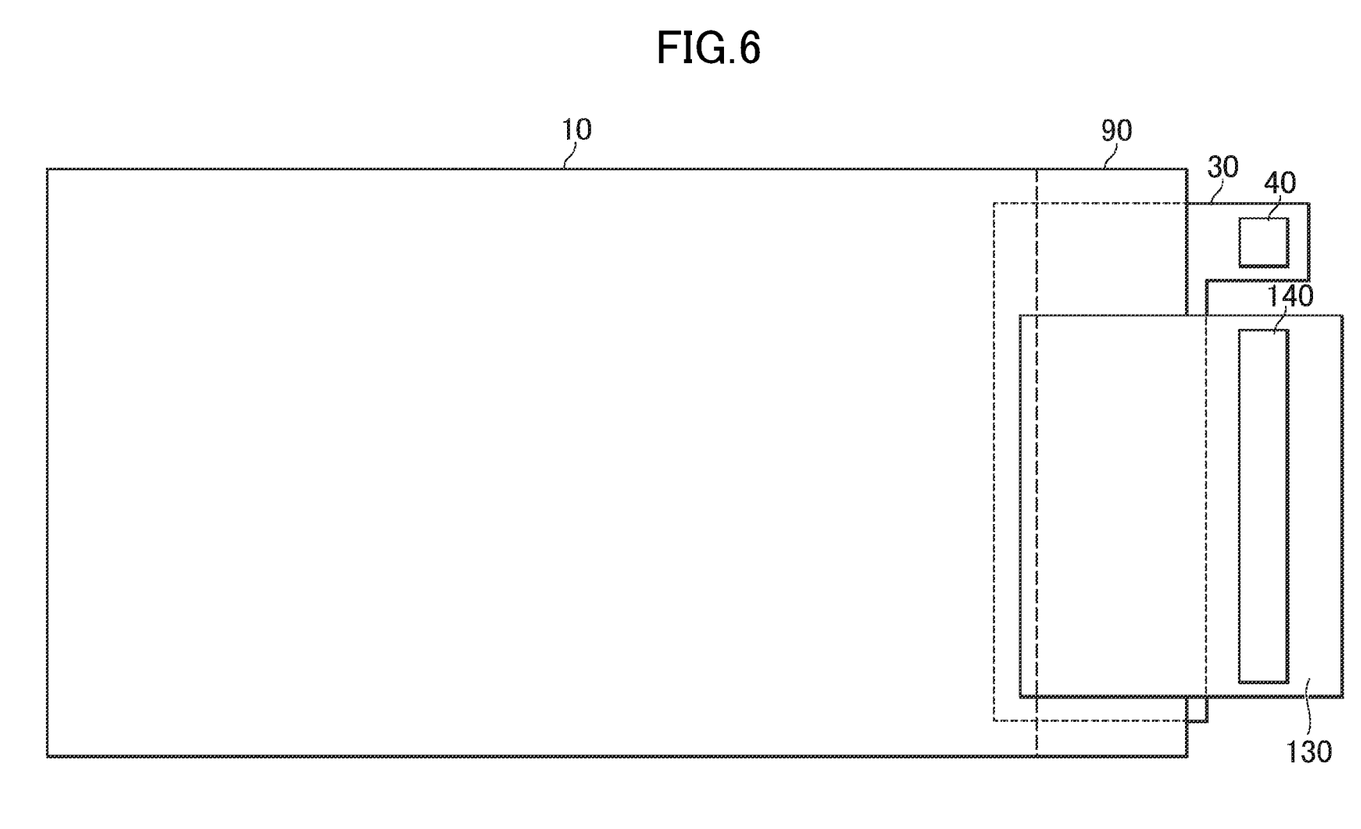
FIG. 6 is a plan view of a display device according to a modification of the second embodiment when viewed from its touch screen side.

FIG. 6 shows a modification using an arrangement that prevents interference between the ICs 40 and 140. FIG. 6 is a plan view of a display device according to a modification of the second embodiment when viewed from its touch screen side. As shown in FIG. 6, the IC 40 and the IC 140 may be arranged at different parts in the transverse direction so as not to interfere with each other. The dashed lines in FIG. 6 are hidden lines indicating the TFT substrate 10 and the flexible wiring substrate 30.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a first substrate having a display area provided with an image display function and a first peripheral area not provided with the image display function;
    a second substrate having an additional function area provided with an additional function added to the image display function, and a second peripheral area not provided with the additional function;
    a first filler between the first substrate and the second substrate;
    a first adhesive outside the first filler, the first adhesive bonding the first peripheral area and the second peripheral area, and
    a sealing material between the first filler and the first adhesive, wherein
    the first substrate has a first bent portion in the first peripheral area,
    the second substrate has a second bent portion in the second peripheral area along the first bent portion, and
    the first adhesive is between the first bent portion and the second bent portion.

2. The display device according to claim 1, further comprising:
    a third substrate having a touch input area and a third peripheral area;
    a second filler between the first substrate and the third substrate or between the second substrate and the third substrate; and
    a second adhesive outside the second filler, the second adhesive bonding the first peripheral area and the third peripheral area or the second peripheral area and the third peripheral area,
    wherein the third substrate has a third bent portion in the third peripheral area.

3. The display device according to claim 1, further comprising
    a first flexible wiring substrate electrically coupled to a first terminal disposed in the first peripheral area of the first substrate, wherein the second substrate extends over the first terminal.

4. The display device according to claim 3, wherein
the first terminal is provided on a side opposite to the display area via the first bent portion in the first substrate.

5. The display device according to claim 2, further comprising
a second flexible wiring substrate electrically coupled to a second terminal disposed in the third peripheral area of the third substrate,
wherein the second terminal is provided on a side opposite to the touch input area via the third bent portion in the third substrate.

6. The display device according to claim 1, wherein the sealing material does not adhere the first bent portion.

7. The display device according to claim 1, further comprising:
a guide which is a cylindrical or columnar member along a transverse direction of the first substrate.

8. The display device according to claim 1, further comprising:
a guide having a curved surface conforming to the first bent portion, wherein
the first substrate is between the guide and the second substrate.

9. The display device according to claim 1, wherein
neither internal tensile stress nor internal compressive stress occurs in a bent portion of the first adhesive.

10. The display device according to claim 1, wherein the first peripheral area has a part and another part which are arranged parallel.

* * * * *